United States Patent
Cirkel et al.

(10) Patent No.: US 6,833,722 B2
(45) Date of Patent: Dec. 21, 2004

(54) ELECTRONIC CIRCUIT DEVICE WITH A SHORT CIRCUIT SWITCH USING TRANSISTORS AND METHOD OF TESTING SUCH A DEVICE

(75) Inventors: Cornelis Oene Cirkel, Nijmegen (NL); Yizi Xing, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 199 days.

(21) Appl. No.: 09/840,815

(22) Filed: Apr. 24, 2001

(65) Prior Publication Data

US 2001/0045840 A1 Nov. 29, 2001

(30) Foreign Application Priority Data

Apr. 26, 2000 (EP) .............................. 00201496

(51) Int. Cl.$^7$ ................................. G01R 31/28
(52) U.S. Cl. ..................... 324/765; 324/158.1
(58) Field of Search .................. 324/73.1, 158.1, 324/763–769; 714/726, 733; 438/14–18; 341/133, 136, 138

(56) References Cited

U.S. PATENT DOCUMENTS 3,400,390 A * 9/1968 Smith .......................... 341/153
5,107,208 A * 4/1992 Lee ............................. 714/733
5,977,763 A * 11/1999 Loughmiller et al. ..... 324/158.1

FOREIGN PATENT DOCUMENTS

| EP | 0434137 A2 | 12/1990 | ........... G01R/31/28 |
| EP | 0720023 A1 | 7/1996 | |

* cited by examiner

*Primary Examiner*—Vinh P. Nguyen
(74) *Attorney, Agent, or Firm*—Michael J. Ure

(57) ABSTRACT

An electronic circuit device has contact terminal outside its package. The contact terminals are connected via the main current channels of two transistors connected in parallel between the contact terminals, so as to provide a switchable short circuit between the terminals. The device is tested by connecting two sense contacts of a resistance measuring device to the terminals and measuring the resistance between the sense contacts a first, second and third state respectively, the first and second transistor being switched on and off respectively in the first state and vice versa in the second state, both transistors being switched on in the third state. The resistance in the three states is modeled as a model resistance composed of a series resistance component in series with a first resistance component, a second resistance component and a parallel arrangement of said first and second resistance component respectively. The series resistance component is eliminate in tests of the device to avoid the effect of an unstable contact resistance between the terminals and the sense contacts.

2 Claims, 1 Drawing Sheet

ELECTRONIC CIRCUIT DEVICE WITH A SHORT CIRCUIT SWITCH USING TRANSISTORS AND METHOD OF TESTING SUCH A DEVICE

BACKGROUND AND SUMMARY OF THE INVENTION

Electronic devices often need to perform the function of a switch, providing either a very high or a very low resistance between two pins or other contact terminals on the outside of the package of the device. A control circuit switches the switch on and off, so as to provide either the very high or very low resistance between the pins (the short circuit is not a matter of glitches: the switch provides a short-circuit persistently if switched-on). Devices with such switches are applied for example in DC/DC converters and other circuits wherein the power supply of other circuits has to flow through the switch.

Usually, this the switchable low resistance is realized by incorporating the main current channel of a switching transistor between the two pins. If the resistance has to be very low it has been found that it becomes difficult and/or expensive to test whether the transistor performs as required. Normally, such a test is performed by connecting the pins to a resistance probe and measuring the resistance connected to the probe, the device being rejected if the measured resistance is too high. However, if the resistance between pins has to be very low, contact resistance of the contact between the probe and the pins may become an uncertain factor in the measurement. It is expensive to ensure that the resistance is low and predictable, as this may slow down testing and/or require expensive probes that need constant maintenance, especially if very small packages have to be tested.

One way of overcoming this problem is to use a four-point measurement. In a four-point measurement current is applied to the device under test via a first pair of connections and the resulting voltage across the device is measured via a second pair of connections. Thus, the measured voltage drop does not include the voltage drop over the contact resistance to the first pair of connections, via which the current is applied. However, this test is also expensive, in that it requires two additional connections to the package of the device if the test is performed after packaging.

Under some circumstances, the device may have other pins that can be temporarily used for the purpose of a four-point measurement during testing. An example of this can be found in European patent application No. 720 023. However, this technique is not generally applicable, as it depends on the type of circuit being used.

Amongst others, it is an object of the invention to provide for a test technique and a device designed for such a test technique for testing the resistance of a switching transistor with only two contact terminals to the transistor, while avoiding unreliable results due to an unpredictable contact resistance.

The method according to the invention is described in claim 1. According to the invention, at least two switching transistors are connected in parallel between the contact terminals. Three resistance values are measured with a probe connected to the contact terminals: one with both transistors switched on, and two with one transistor switched on and the other transistor switched off. From the three measurements, three resistances can be computed: the resistances of the parallel branches inside the package (each of which contains a switching transistor) and the resistance of the connection between the probe and the parallel branches. Thus, the contact resistance can be eliminated from the measurement of the resistance of the switching transistors.

Preferably, the different switching transistors are incorporated in a single semi-conductor substrate, the main current channel of each transistor being connected to a different bondpad, the bondpads being connected to the same contact terminal via different bonding wires. This reduces the effect of electromigration and allows incorporation of both the resistance of the switching transistor and the bonding wire in the measured resistance from which the contact resistance is eliminated.

In an embodiment, the bondpads for the different switching transistors are mutually connected inside the integrated circuit by a relatively high resistance (compared with the "on" resistance of the switching transistors). This allows a four-point measurement of the switching resistance of each switching transistor is before the device is finally packaged. At this stage more contacts are possible than just the two contact terminals. Hence, one can use one bondpad of one transistor to supply the current and the bondpad of the other transistor to measure the resulting voltage drop.

BRIEF DESCRIPTION OF THE DRAWING

These and other advantageous aspects of the circuit according to the invention will be described in more detail using the following figures, of which

DETAILED DESCRIPTION OF THE INVENTION

Figure 1:
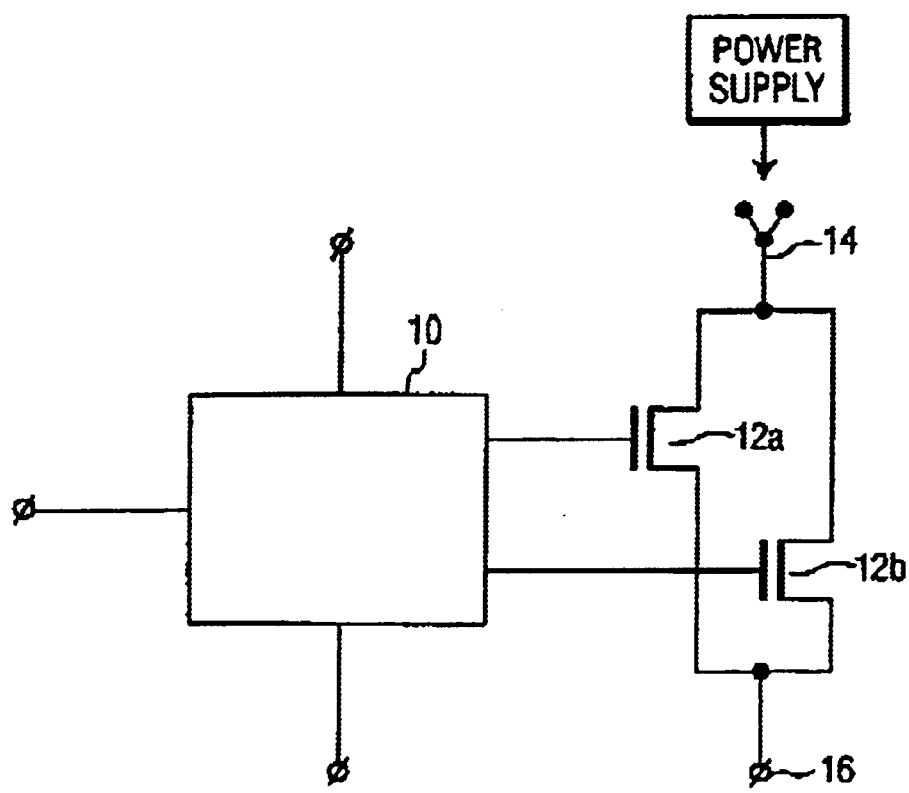
FIG. 1 shows a circuit diagram of an electronic circuit device.

FIG. 1 shows a circuit diagram of an electronic device, for example part of a DC/DC converter or another circuit wherein the power supply of other circuits (not shown) has to flow between outputs 14, 16 through the switch 12a, b. The circuit diagram shows a control circuit 10, a first output transistor 12a, a second output transistor 12b and outputs 14, 16. The control circuit 10 has a first and second output coupled to the control electrode of first and second output transistor 12a, b. The main current channels of the first and second output transistor 12a, b are connected in parallel between the outputs 14, 16. In normal use, the circuit is packaged in a standard package such as the SO-8 package, the TSSOP-8 package, the HTSSOP-16 package or in a flip-chip. The outputs 14, 16 are external terminals of such a package, the individual source connections of the output transistors 12a, b are not accessible separately from one another from outside the package. The same holds for their drain connections.

In normal operation, the main current channels of the output transistors 12a, b function to provide a switchable short circuit between the outputs 12a, b. That is, under control of control circuit 10, output transistors 12a, b are either made conductive or non-conductive, and when conductive the resistance between outputs 14, 16 is determined substantially by the resistances of the main current channels of the output transistors 12a, b and of the conductors connecting these main current channels to the outputs (the latter making up for example 20% of the resistance).

One example of an application of a device with the circuit in FIG. 1 is in a DC/DC converter, but such a device may also be applied in other circuits where a switchable short circuit is required. When the device with the circuit of FIG.

1 is used in a DC/DC converter, the resistance between the outputs 14, 16 is a key parameter for the efficiency of DC/DC conversion. To ensure that this efficiency meets specifications it is desirable to measure the resistance of the device after packaging, but before the circuit is incorporated in a DC/DC converter circuit. This resistance must be in the range of 40 to 100 milli-ohm for example. If the resistance is higher than a specified value, the device should be rejected. One would prefer to perform this measurement with a handler that contacts the outputs 14, 16 mechanically. However, the contact resistance of such contacts is normally unstable and may vary between for example 50 to 500 milli-ohm, i.e. larger than the extremely low resistance required for the device. To overcome problems with the contact resistance, a more complicated handler would be required, for example a handler for a four-point resistance measurement, which makes two contacts to each output, one for applying current and one for measuring the resulting voltage drop. This is undesirable for economical reasons and it may be impractical for very small packages.

To overcome this problem, the control circuit 10 is arranged so that it can be brought into a test mode. In the test mode, the control circuit can bring either one of the output transistors 12a, b into a conductive state while the other is substantially non-conductive. The control circuit may also be arranged to bring both output transistors 12a, b into the conductive state simultaneously in the test mode, but this is not necessary, since simultaneous conduction is already available in the normal operating mode.

Figure 2:
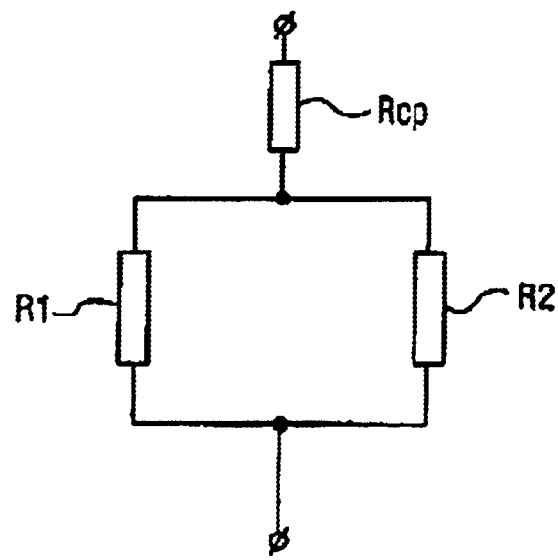
FIG. 2 shows an equivalent resistance diagram.

FIG. 2 shows an equivalent resistance diagram of the resistance visible to the handler when the circuit of FIG. 1 is connected to the handler and both output transistors 12a, b conduct. The equivalent resistance is composed of a series resistance Rcb in series with a parallel arrangement of two resistances R1, R2. The resistances R1, R2 correspond to the resistances of the main current channel of the output transistors 12a, b respectively, and any further resistance between the nodes where these channels are connected to each other. The resistance Rcb corresponds to the resistance from these nodes to the resistance measuring circuit in the handler. This resistance contains the contact resistance between the probes of the handler and the outputs 14, 16 of the device to which these probes are connected. Of course, there are two such resistances, one for each output 14, 16, but in terms of an equivalent circuit these resistances show up as a single series resistance Rcb.

In the mode where the main current channels of both transistors 12a, b are conductive, the resistance measured by the handler equals the resistance Z=R1//R2+Rcb: the resistance Rcb in series with the parallel resistance R1//R2 of the resistances R1, R2. In the states of the test mode where one output transistor 12a, b is made conductive and the other is made non-conductive, the resistance measured by the handler is X=Rcb+R1 and Y=Rcb+R2 respectively. It has been found that the series resistance Rcb, although unpredictable, remains sufficiently constant during the period needed to measure X, Y, Z successively to compute the individual resistances R1, R2 and Rcb and the parallel resistance R1//R2, from successive measurement of the three resistances X, Y, Z, according to $$R1//R2=SQRT(Z*(Z-X-Y)+X*Y)$$

$$Rcb=Z-R1//R2$$

$$R1=X-(Z-R1//R2)$$

$$R2=Y-(Z-R1//R2)$$

("SQRT" denoting the square root function: SQRT(u) *SQRT(u)=u for any u). Thus, the resistance R1//R2 of the output transistors 12a, b for use in the normal operating mode can be tested, even though the resistance Rcb, that contains the unstable contact resistance between the outputs 14, 16 and the probes of the handler, is unknown. Similarly, the individual resistances R1, R2 can be tested in this way. In addition, a warning signal can be given if the contact resistance (Rcb) becomes higher than a threshold value, indicating a problem with the handler.

Of course, in practice it may not be necessary to compute the resistances explicitly. For example, if it is only required to compare R1//R2 with a threshold T, then it may suffice to compute the argument of the "SQRT" function and to compare that argument with the square T*T of the threshold T, or any other equivalent test. Similarly, if it should be tested that the resistances R1, R2 should each be below a threshold T', it suffices to take the maximum of X and Y and to test if that maximum is below T'+Z−R1//R2 etc.

In addition, the value of the resistance Rcb may be used to signal problems with the contacts of the handler if this resistance Rcb exceeds a threshold value.

Preferably, the sources of the first and second output transistors 12a, b are connected to different bond pads of the semi-conductor substrate in which these output transistors 12a, b are incorporated and similarly for the drains. Bonding wires are used to connect these bond pads in common to the output pins 14, 16. This allows a fuller test before the circuit is packaged in a package wherein only the outputs 14, 16 are accessible. At this stage, four point measurements may be used, where the bond pads of one output transistor 12a, b are used to apply current while the bond pads of the other output transistor 12a, b are used to measure the resulting voltage drop, if need be via relatively large resistors between the drains and between the sources of the output transistors 12a, b respectively (relatively large, that is, in comparison with the "on" resistance of the output transistors 12a, b). This involves two measurements, each with a respective one of the output transistors 12a, b switched off, while the other conducts. This allows for testing of the resistance of the output transistors 12a, b before the circuit is packaged. Thus, problems with the transistors and problems with the bond wires can be isolated from one another.

What is claimed is:

1. A method of accurately determining a resistance of a switch comprising a plurality of parallel-connected transistors, the method comprising:

making contact between the switch and measuring device;

measuring a first resistance of the switch with only a first one of the transistors turned on;

measuring a second resistance of the switch with only a second different one of the transistors turned on;

measuring a third resistance of the switch with both the first transistor and the second transistor turned on; and using the first, second and third resistances, computing a final resistance of the switch so as to reduce the influence of a contact resistance between the switch and the measuring device.

2. A packaged integrated circuit comprising:

a switch comprising a plurality of parallel-connected transistors, one terminal of the switch being coupled to one pin of the integrated circuit and another terminal of the switch being coupled to another pin of the integrated circuit; and a control circuit coupled to each of the plurality of transistors to turn each of the plurality of transistors on or off, the control circuit having a test mode;

wherein the control circuit, in said test mode, controls the plurality of transistors such that, in the course of said test mode:

during one period of time only one of the transistors is turned on;

during another different period of time, only a different one of the transistors is turned on; and during still another period of time, both the one transistor and the different transistor are turned on.

* * * * *